United States Patent
Oh et al.

(10) Patent No.: US 11,348,992 B2
(45) Date of Patent: *May 31, 2022

(54) DISPLAY APPARATUS

(71) Applicant: SAMSUNG DISPLAY CO., LTD., Yongin-si (KR)

(72) Inventors: Soohee Oh, Yongin-si (KR); Chulkyu Kang, Yongin-si (KR); Kyunghoon Kim, Yongin-si (KR); Sunghwan Kim, Yongin-si (KR); Hyunchol Bang, Yongin-si (KR); Dongsun Lee, Yongin-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 38 days.

This patent is subject to a terminal disclaimer.

(21) Appl. No.: 16/775,545

(22) Filed: Jan. 29, 2020

(65) Prior Publication Data

US 2020/0403059 A1     Dec. 24, 2020

(30) Foreign Application Priority Data

Jun. 21, 2019 (KR) .................. 10-2019-0074199

(51) Int. Cl.
*H01L 27/32* (2006.01)
*G09G 3/3225* (2016.01)

(52) U.S. Cl.
CPC ...... *H01L 27/3279* (2013.01); *H01L 27/3262* (2013.01); *H01L 27/3265* (2013.01); *H01L 27/3272* (2013.01); *G09G 3/3225* (2013.01); *G09G 2300/0842* (2013.01)

(58) Field of Classification Search
CPC ............. H01L 27/3279; H01L 27/3276; H01L 27/3262

See application file for complete search history.

(56) References Cited

U.S. PATENT DOCUMENTS

| 8,686,927 | B2 | 4/2014 | Kang et al. |
| 9,786,725 | B2 * | 10/2017 | Pyon .................. H01L 27/3272 |
| 10,103,208 | B2 | 10/2018 | Choi et al. |
| 10,923,549 | B2 * | 2/2021 | Lee .................... H01L 27/3272 |
| 2018/0005576 | A1 | 1/2018 | Yoon et al. |
| 2018/0006263 | A1 | 1/2018 | Yoon et al. |

(Continued)

FOREIGN PATENT DOCUMENTS

| KR | 1020100075058 A | 7/2010 |
| KR | 1020160113376 A | 9/2016 |

(Continued)

*Primary Examiner* — Tuan A Hoang
(74) *Attorney, Agent, or Firm* — Cantor Colburn LLP

(57) ABSTRACT

A display apparatus includes a substrate, a driving thin-film transistor arranged on the substrate and including a driving semiconductor layer and a driving gate electrode, a first scanning line arranged on the first substrate and which extends in a first direction, a data line which extends in a second direction that intersects with the first direction, a node connection line arranged in the same layer as the first scanning line, and a shielding conductive layer arranged between the data line and the node connection line and disposed in the same layer as the driving gate electrode, where an end of the node connection line is connected to the driving gate electrode through a first node contact hole.

20 Claims, 13 Drawing Sheets

(56) References Cited

U.S. PATENT DOCUMENTS

2018/0330673 A1   11/2018  Kang et al.
2020/0194529 A1*  6/2020   Lee ......................... H01L 28/60

FOREIGN PATENT DOCUMENTS

| KR | 101768848 B1 | 8/2017 |
| KR | 1020170141855 A | 12/2017 |
| KR | 1020180125670 A | 11/2018 |

* cited by examiner

DISPLAY APPARATUS

This application claims priority to Korean Patent Application No. 10-2019-0074199, filed on Jun. 21, 2019, and all the benefits accruing therefrom under 35 U.S.C. § 119, the content of which in its entirety is herein incorporated by reference.

BACKGROUND

1. Field

One or more exemplary embodiments relate to a display apparatus, and more particularly, to a display apparatus for realizing high quality.

2. Description of Related Art

A display apparatus is an apparatus to visually express data. The display apparatus includes a substrate divided into a display area and a peripheral area. The display area includes scanning lines and data lines insulated from one another and a plurality of pixels. The display area further includes thin-film transistors and pixel electrodes electrically connected to the thin-film transistors in correspondence to the respective pixels. The display area may also include an opposite electrode that is provided in common in the pixels. The peripheral area may include various wires for delivering electrical signals to the display area, a scan driver, a data driver, a controller, or the like.

The display apparatus is used for various purposes. In addition, due to small thickness and lightweight, the display apparatus is more widely used. Pixel circuits included in pixels have been designed in various forms to realize high quality and high resolution of display apparatuses.

SUMMARY

One or more exemplary embodiments provide a display apparatus for realizing a high quality image. However, the objective is only exemplary and the scope of the exemplary embodiments is not limited thereto.

Additional aspects will be set forth in part in the description which follows and, in part, will be apparent from the description, or may be learned by practice of the presented exemplary embodiments.

According to one or more exemplary embodiments, a display apparatus includes a substrate, a driving thin-film transistor arranged on the substrate and including a driving semiconductor layer and a driving gate electrode, a first scanning line arranged on the substrate and which extends in a first direction, a data line which extends in a second direction that intersects with the first direction, a node connection line arranged in the same layer as the first scanning line, and a shielding conductive layer arranged between the data line and the node connection line and disposed in the same layer as the driving gate electrode, where an end of the node connection line is connected to the driving gate electrode through a first node contact hole.

In an exemplary embodiment, the display apparatus may further include a first gate electrode layer connected to the first scanning line through a third contact hole, where the shielding conductive layer extends from the first gate electrode layer.

In an exemplary embodiment, the shielding conductive layer and the node connection line may extend in the second direction.

In an exemplary embodiment, the first gate electrode layer may include a compensation gate electrode of a compensation thin-film transistor and a switching gate electrode of a switching thin-film transistor, and the shielding conductive layer may be arranged between the compensation gate electrode and the switching gate electrode.

In an exemplary embodiment, the display apparatus may further include a driving voltage line which extends in the second direction and arranged in the same layer as the data line, and the shielding conductive layer may be arranged between the data line and the driving voltage line.

In an exemplary embodiment, the display apparatus may further include a compensation thin-film transistor connected to the first scanning line and including a compensation semiconductor layer and a compensation gate electrode, and the other end of the node connection line may be connected to the compensation semiconductor layer through a second node contact hole.

In an exemplary embodiment, a resistance value of the first scanning line may be less than a resistance value of the driving gate electrode.

In an exemplary embodiment, the display apparatus may further include a storage capacitor including the driving gate electrode as a lower electrode and an upper electrode which overlaps the lower electrode and defines a storage opening having a closed shape, and the first node contact hole may be arranged in the storage opening.

In an exemplary embodiment, a size of the storage opening may be greater than a size of the first node contact hole.

In an exemplary embodiment, the display apparatus may further include an emission control thin-film transistor arranged on the substrate and including an emission control semiconductor layer and an emission control gate electrode, and an emission control line which delivers an emission control signal to the emission control gate electrode, where the emission control gate electrode may be provided as a portion of the emission control line.

In an exemplary embodiment, the display apparatus may further include a second scanning line apart from the first scanning line and extending in the first direction, and a second gate electrode layer connected to the second scanning line through a fourth contact hole, where the shielding conductive layer may extend from the second gate electrode layer.

In an exemplary embodiment, the second gate electrode layer may be a part of a first initialization gate electrode of a first initialization thin-film transistor.

In an exemplary embodiment, the first initialization gate electrode may have a bent shape.

In an exemplary embodiment, the shielding conductive layer may extend in the second direction.

According to one or more exemplary embodiments, a display apparatus includes a substrate, a driving thin-film transistor which is arranged on the substrate and includes a driving gate electrode and a driving semiconductor layer arranged with a first gate insulating layer therebetween, a shielding conductive layer arranged in the same layer as the driving gate electrode, a second gate insulating layer and an interlayer insulating layer arranged on the shielding conductive layer, a node connection line arranged on the interlayer insulating layer and connected to the driving gate electrode through a first node contact hole that penetrates the interlayer insulating layer and the second gate insulating layer, a first scanning line arranged in the same layer as the node connection line and which extends in a first direction, a via layer which covers the first scanning line and the node connection line, and a data line arranged on the via layer and which extends in a second direction that intersects with the first direction, where the shielding conductive layer may extend in the second direction between the data line and the node connection line.

In an exemplary embodiment, the display apparatus may further include a first gate electrode layer connected to the first scanning line through a third contact hole, and the shielding conductive layer may extend from the first gate electrode layer.

In an exemplary embodiment, the display apparatus may further include a second scanning line extending in the first direction, and a second gate electrode layer connected to the second scanning line through a fourth contact hole, where the shielding conductive layer may extend from the second gate electrode layer.

In an exemplary embodiment, the driving semiconductor layer may be bent.

In an exemplary embodiment, the display apparatus may further include a driving voltage line which extends in the second direction and arranged in the same layer as the data line, and the node connection line may overlap the driving voltage line.

In an exemplary embodiment, the shielding conductive layer may receive a scanning signal.

BRIEF DESCRIPTION OF THE DRAWINGS

The above and other aspects, features, and advantages of certain exemplary embodiments will be more apparent from the following description taken in conjunction with the accompanying drawings, in which.

DETAILED DESCRIPTION

Figure 1:
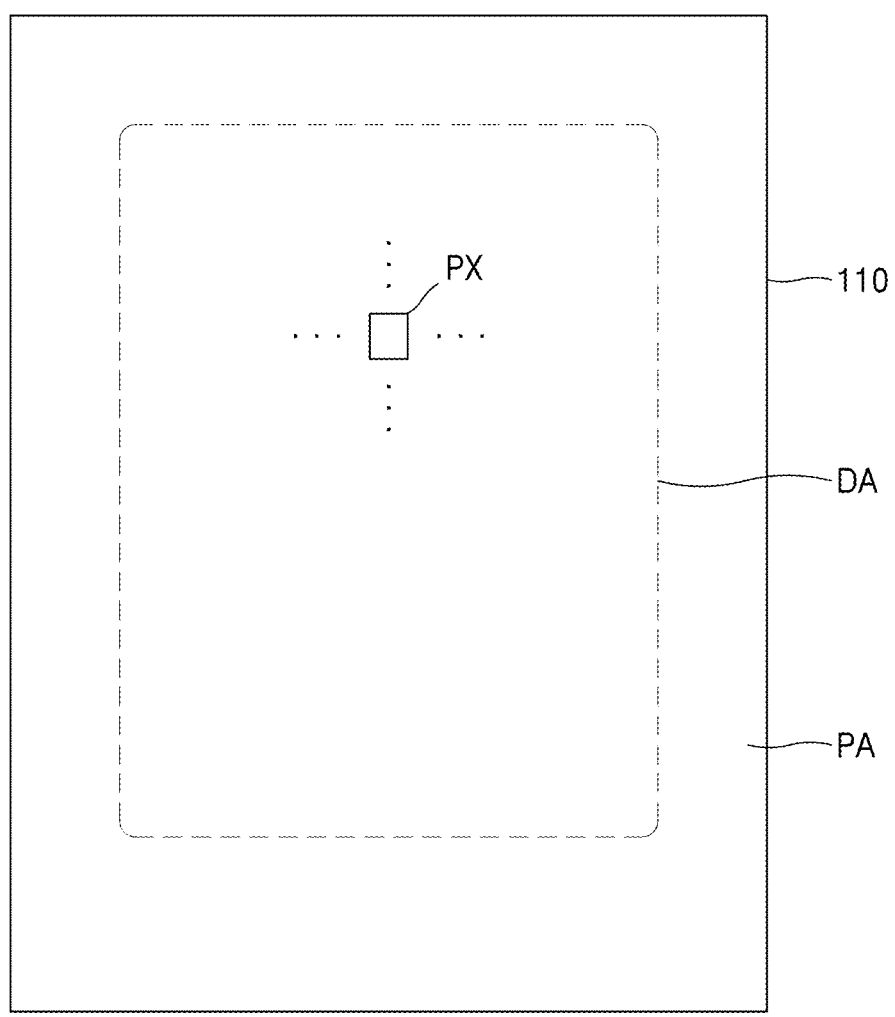
FIG. 1 is a schematic top-plan view of a display apparatus according to an exemplary embodiment.
Figure 1:

Reference will now be made in detail to exemplary embodiments, examples of which are illustrated in the accompanying drawings, wherein like reference numerals refer to like elements throughout. In this regard, the present exemplary embodiments may have different forms and should not be construed as being limited to the descriptions set forth herein. Accordingly, the exemplary embodiments are merely described below, by referring to the figures, to explain aspects of the present description. The terminology used herein is for the purpose of describing particular embodiments only and is not intended to be limiting. As used herein, the singular forms "a," "an," and "the" are intended to include the plural forms, including "at least one," unless the content clearly indicates otherwise. "At least one" is not to be construed as limiting "a" or "an." "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

In the exemplary embodiments, when a layer, a region, a component or the like are referred to as being "on" another layer, region, or component, the layer, region, or the component may be directly on the other layer, region, component or an intervening layer, region, component may be present therebetween.

Sizes of components in the drawings may be exaggerated for convenience of explanation. In other words, since sizes and thicknesses of components in the drawings are arbitrarily illustrated for convenience of explanation, the following exemplary embodiments are not limited thereto. It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

In following exemplary embodiments, when a layer, region, or component is connected to another layer, region, or component, the layer, region, or component may be directly connected to the other layer, region, or component, and may be indirectly connected to the other layer, region, or component with another layer, region, or component therebetween. For example, in the present specification, when a layer, region, or component is electrically connected to another layer, region, or component, the layer, region, or component may be electrically connected in a direct manner to the other layer, region, or component, and electrically connected in an indirect manner to the other layer, region, or component with another layer, region, or component therebetween.

The display apparatus, which is an apparatus to display an image, may include a liquid crystal display, an electrophoretic display, an organic light-emitting display, an inorganic light-emitting display, a field emission display, a surface-conduction electron-emitter display, a plasma display, a cathode ray display, or the like.

Hereinafter, an organic light-emitting display apparatus is described as an example of a display apparatus according to an exemplary embodiment, but the display apparatus according to the invention is not limited thereto, and the display apparatus may be various types of display apparatuses.

FIG. 1 is a schematic top-plan view of a display apparatus according to an exemplary embodiment.

Referring to FIG. 1, the display apparatus includes a display area DA and a peripheral area PA that surrounds the display area DA. Pixels PX each including an organic light-emitting device ("OLED") may be arranged in the display area DA to provide an image. The peripheral area PA, which is an area where an image is not provided and is called a non-display area, may include a scan driver and a data driver for providing electrical signals to be applied to the pixels PX and power lines for providing power such as a driving voltage and a common voltage.

Figure 2:
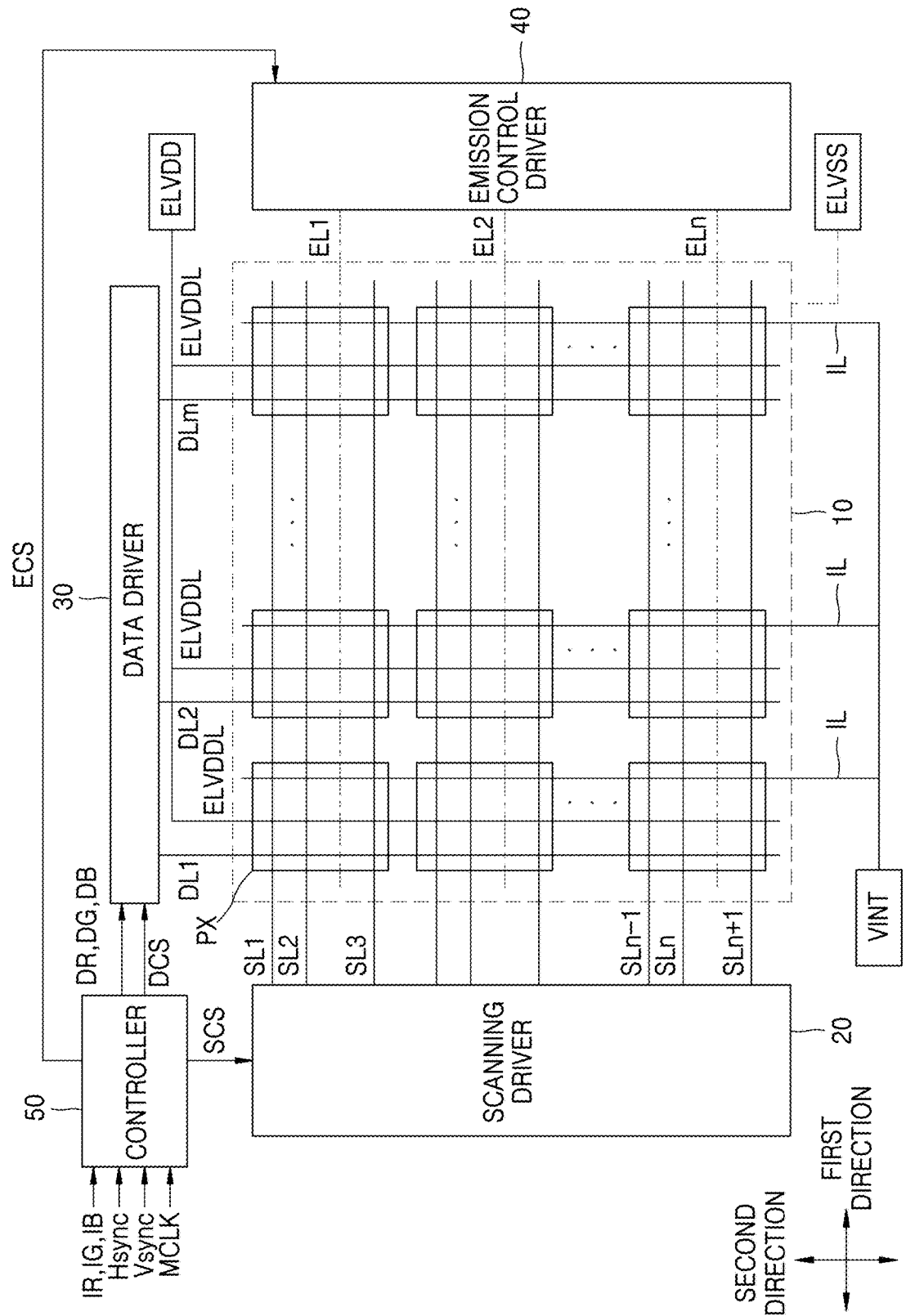
FIG. 2 is a schematic block diagram of a display apparatus according to an exemplary embodiment.

FIG. 2 is a schematic block diagram of a display apparatus according to an exemplary embodiment.

The display apparatus according to an exemplary embodiment includes a display unit 10 including a plurality of pixels PX, a scan driver 20, a data driver 30, an emission control driver 40, and a controller 50.

The display unit 10 is arranged in the display area DA and located at an intersection of a plurality of scanning lines SL1 through SLn+1, a plurality of data lines DL1 through DLm, and a plurality of emission control lines EL1 through ELn, and includes a plurality of pixels PX approximately arranged in a matrix. The plurality of scanning lines SL1 through SLn+1 and the plurality of emission control lines EL1 through ELn extend in a first direction that is a row direction, and the plurality of data lines DL1 through DLm and a driving voltage line ELVDDL extends in a second direction that is a column direction. In one pixel line, an n value of the plurality of scanning lines SL1 through SLn+1 may be different from an n value of the plurality of emission control lines EL1 through ELn.

Each pixel PX is connected to three scanning lines from among the plurality of scanning lines SL1 through SLn+1 provided to the display unit 10. The scan driver 20 generates three scanning signals and transmits the scanning signals to each pixel PX through the plurality of scanning lines SL1 through SLn+1. That is, the scan driver 20 sequentially provides the current scanning signals to scanning lines SL2 through SLn, previous scanning lines SL1 through SLn−1, or next scanning lines SL3 through SLn+1.

An initialization voltage line IL may receive an initialization voltage from a power supply source VINT at the outside and provide the initialization voltage to each pixel PX.

In addition, each pixel PX is connected to a data line among the plurality of data lines DL1 through DLm connected to the display unit 10 and an emission control line among the plurality of emission control lines EL1 through ELn connected to the display unit 10.

The data driver 30 delivers a data signal to the pixels PX through the plurality of data lines DL1 through DLm. Each time the scanning signal is provided to the scanning lines SL2 through SLn, the data signal is provided to a pixel PX that is selected in response to the scanning signal.

The emission control driver 40 generates an emission control signal and delivers the emission control signal to pixels PX through the plurality of emission control lines EL1 through ELn. The emission control signal controls an emission time of the pixel PX. The emission control driver 40 may be omitted according to an internal structure of the pixel PX.

The controller 50 converts a plurality of image signals IR, IG, and IB, which is delivered from the outside, into a plurality of image data signals DR, DG, and DB, and delivers the image data signals DR, DG, and DB to the data driver 30. In addition, the controller 50 receives a vertical synchronization signal Vsync, a horizontal synchronization signal Hsync, and a clock signal MCLK, generates control signals for controlling driving of the scan driver 20, the data driver 30, and the emission control driver 40, and delivers the control signals to the scan driver 20, the data driver 30, and the emission control driver 40, respectively. That is, the controller 50 generates a scanning driving control signal SCS for controlling the scan driver 20, a data driving control signal DCS for controlling the data driver 30, and an emission driving control signal ECS for controlling the emission control driver 40 and delivers the above-described signals.

The plurality of pixels PX each receives a driving power voltage ELVDD and a common power voltage ELVSS from the outside. The driving power voltage ELVDD may be a high-level voltage, and the common power voltage ELVSS may be a voltage lower than the driving power voltage ELVDD or a ground voltage. The driving power voltage ELVDD is supplied to each pixel PX through the driving voltage line ELVDDL.

The plurality of pixels PX each emits light having a certain luminance by a driving current that is provided to a light-emitting device of the pixel PX in response to the data signal delivered through the plurality of data lines DL1 through DLm.

Figure 3:
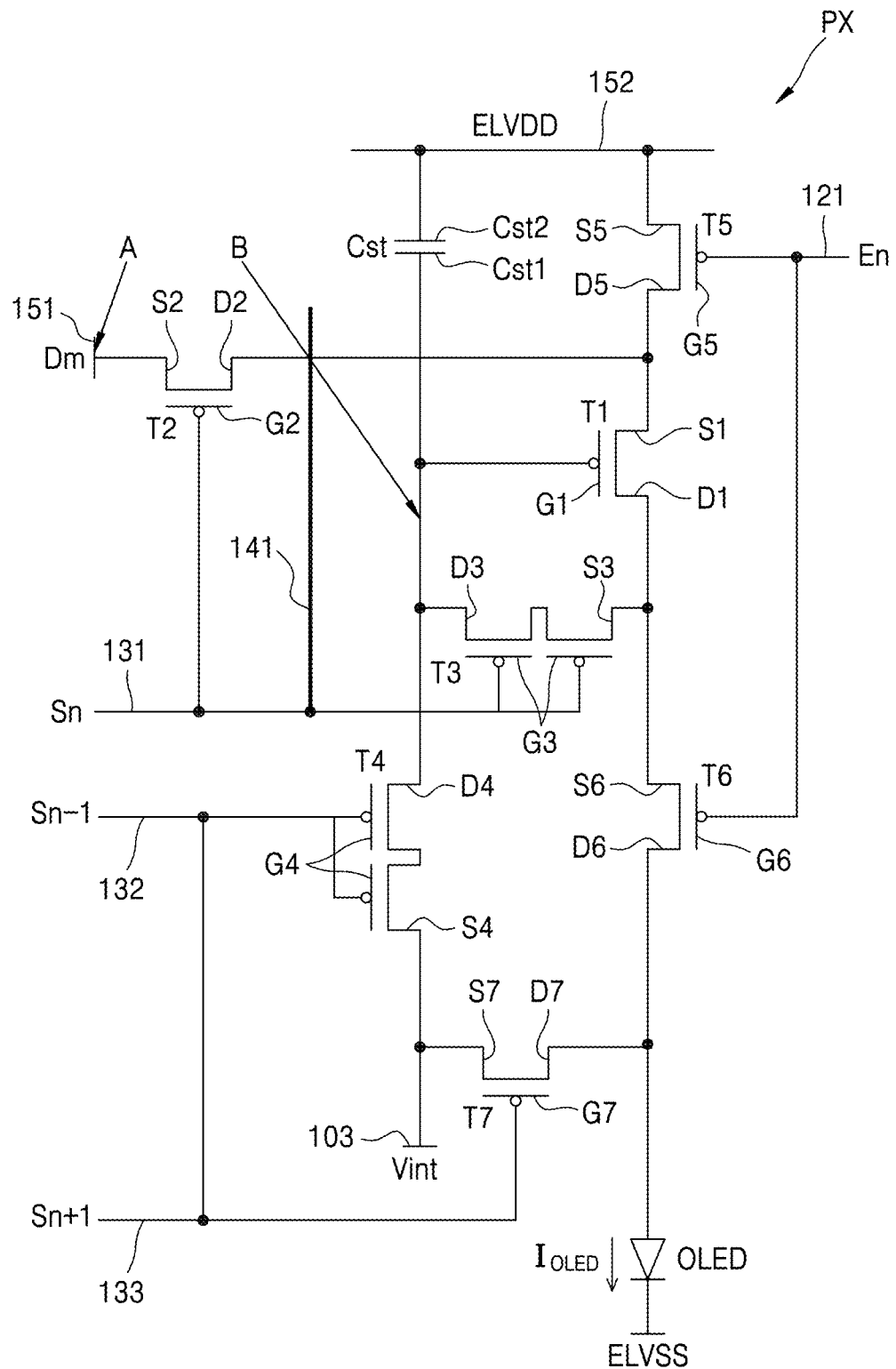
FIG. 3 is an exemplary embodiment of an equivalent circuit diagram of a pixel included in the display apparatus shown in FIG. 1.

FIG. 3 is an exemplary embodiment of an equivalent circuit diagram of a pixel included in the display apparatus shown in FIG. 1.

Referring to FIG. 3, the pixel PX includes scanning lines 121, 131, 132, 133, and 151, a plurality of thin-film transistors T1, T2, T3, T4, T5, T6, and T7 connected to the signal lines, a capacitor Cst, an initialization voltage line 103, a driving voltage line 152, and an organic light-emitting device OLED.

FIG. 3 shows a case in which each pixel PX includes the signal lines 121, 131, 132, 133, and 151, the initialization voltage line 103, and the driving voltage line 152, but the present invention is not limited thereto. As another exemplary embodiment, at least one of the signal lines 121, 131, 132, 133, and 151 or/and the initialization voltage line 103 may be shared by neighboring pixels.

The thin-film transistor may include a driving thin-film transistor T1, a switching thin-film transistor T2, a compensation thin-film transistor T3, a first initialization thin-film transistor T4, an operation control thin-film transistor T5, an emission control thin-film transistor T6, and a second initialization thin-film transistor T7.

The signal lines include the current scanning line 131 delivering a scanning signal Sn, the previous scanning line 132 delivering a previous scanning signal Sn−1 to the first initialization thin-film transistor T4, a next scanning line 133 delivering a next scanning signal Sn+1 to the second initialization thin-film transistor T7, the emission control line 121 delivering an emission control signal En to the operation control thin-film transistor T5 and the emission control thin-film transistor T6, and the data line 151 intersecting with the current scanning line 131 and delivering a data signal Dm. The driving voltage line 152 delivers a driving voltage ELVDD to the driving thin-film transistor T1, and the initialization voltage line 103 delivers an initialization voltage Vint initializing the driving thin-film transistor T1 and a pixel electrode of the organic light-emitting diode OLED.

A driving gate electrode G1 of the driving thin-film transistor T1 is connected to a lower electrode Cst1 of the storage capacitor Cst, a driving source electrode S1 of the driving thin-film transistor T1 is connected to the driving voltage line 152 via the operation control thin film transistor T5, and a driving drain electrode D1 of the driving thin-film transistor T1 is electrically connected to the pixel electrode of the organic light-emitting device OLED via the emission control thin-film transistor T6. The driving thin-film transistor T1 receives the data signal Dm in response to a switching operation of the switching thin-film transistor T2 and provides a driving current $I_{OLED}$ to the organic light-emitting device OLED.

A switching gate electrode G2 of the switching thin-film transistor T2 is connected to the current scanning line 131, a switching source electrode S2 of the switching thin-film transistor T2 is connected to the data line 151, and a switching drain electrode D2 of the switching thin-film transistor T2 is connected to the driving source electrode S1 of the driving thin-film transistor T1 and is also connected to the driving voltage line 152 via the operation control thin-film transistor T5. The switching thin-film transistor T2 is turned on in response to the scanning signal Sn that is delivered through the current scanning line 131 and performs a switching operation of delivering the data signal Dm, which is delivered through the data line 151, to the driving source electrode S1 of the driving thin-film transistor T1.

A compensation gate electrode G3 of the compensation thin-film transistor T3 is connected to the current scanning line 131, a compensation source electrode S3 of the compensation thin-film transistor T3 is connected to the driving drain electrode D1 of the driving thin-film transistor T1 and also connected to the pixel electrode of the organic light-emitting device OLED via the emission control thin-film transistor T6, and a compensation drain electrode D3 of the compensation thin-film transistor T3 is connected to the lower electrode Cst1 of the storage capacitor Cst, a first initialization drain electrode D4 of the first initialization thin-film transistor T4, and the driving gate electrode G1 of the driving thin-film transistor T1. The compensation thin-film transistor T3 is turned on in response to the scanning signal Sn received through the current scanning line 131 and electrically connects the driving gate electrode G1 and the driving drain electrode D1 of the driving thin-film transistor T1 to each other, thereby diode-connecting the driving thin-film transistor T1.

The first initialization gate electrode G4 of the first initialization thin-film transistor T4 is connected to the previous scanning line 132, the first initialization source electrode S4 of the first initialization thin-film transistor T4 is connected to a second initialization source electrode S7 of the second initialization thin-film transistor T7 and the initialization voltage line 103, and a first initialization drain electrode D4 of the first initialization thin-film transistor T4 is connected to the lower electrode Cst1 of the storage capacitor Cst, the compensation drain electrode D3 of the compensation thin-film transistor T3, and the driving gate electrode G1 of the driving thin-film transistor T1. The first initialization thin-film transistor T4 is turned on in response to the previous scanning signal Sn−1 that is delivered through the previous scanning line 132 and delivers the initialization voltage Vint to the driving gate electrode G1 of the driving thin-film transistor T1, thereby performing an initialization operation of initializing a voltage of the driving gate electrode G1 of the driving thin-film transistor T1.

An operation control gate electrode G5 of the operation control thin-film transistor T5 is connected to the emission control line 121, an operation control source electrode S5 of the operation control thin-film transistor T5 is connected to the driving voltage line 152, and an operation control drain electrode D5 of the operation control thin-film transistor T5 is connected to the driving source electrode S1 of the driving thin-film transistor T1 and the switching drain electrode D2 of the switching thin-film transistor T2.

An emission control gate electrode G6 of the emission control thin-film transistor T6 is connected to the emission control line 121, an emission control source electrode S6 of the emission control thin-film transistor T6 is connected to the driving drain electrode D1 of the driving thin-film transistor T1 and the compensation source electrode S3 of the compensation thin-film transistor T3, and an emission control drain electrode D6 of the emission control thin-film transistor T6 is electrically connected to a second initialization drain electrode D7 of the second initialization thin-film transistor T7 and the pixel electrode of the organic light-emitting device OLED. The emission control gate electrode G6 may be provided as a portion of the emission control line 121.

The operation control thin-film transistor T5 and the emission control thin-film transistor T6 are simultaneously turned on in response to the emission control signal En delivered through the emission control line 121 such that the driving voltage ELVDD is delivered to the organic light-emitting device OLED and the driving current $I_{OLED}$ flows through the organic light-emitting device OLED.

The second initialization gate electrode G7 of the second initialization thin-film transistor T7 is connected to the next scanning line 133, the second initialization drain electrode D7 of the second initialization thin-film transistor T7 is connected to the emission control drain electrode D6 of the emission control thin-film transistor T6 and the pixel electrode of the organic light-emitting device OLED, and the second initialization source electrode S7 of the second initialization thin-film transistor T7 is connected to the first initialization source electrode S4 of the first initialization thin-film transistor T4 and the initialization voltage line 103. The second initialization thin-film transistor T7 is turned on in response to the next scanning signal Sn+1 delivered through the next scanning line 133 and initializes the pixel electrode of the organic light-emitting device OLED.

Although FIG. 3 shows a case in which the first initialization thin-film transistor T4 and the second thin-film transistor T7 are respectively connected to the previous scanning line 132 and the next scanning line 133, the invention is not limited thereto. As another exemplary embodiment, the first initialization thin-film transistor T4 and the second initialization thin-film transistor T7 may be both connected to the previous scanning line 132 and be driven in response to the previous scanning signal Sn−1. In addition, positions of the source electrodes S1 through S7 and the drain electrodes D1 through D4 shown in FIG. 3 may be changed with one another depending on whether the thin-film transistors are p-type or n-type.

A detailed operation of each pixel PX according to an exemplary embodiment is as follows.

During an initialization period, when the previous scanning signal Sn−1 is provided through the previous scanning line 132, the first initialization thin-film transistor T4 is turned on in response to the previous scanning signal Sn−1 and the driving thin-film transistor T1 is initialized by the initialization voltage Vint provided from the initialization voltage line 103.

During a data programming period, when the scanning signal Sn is provided through the current scanning line 131, the switching thin-film transistor T2 and the compensation thin-film transistor T3 are turned on in response to the scanning signal Sn. In this case, the driving thin-film transistor T1 is diode-connected by the compensation thin-film transistor T3, which is turned on, and is biased in a forward direction.

By doing so, a compensation voltage Dm+Vth, which is a value reduced from the data signal Dm provided from the data line 151 by a threshold voltage Vth (Vth is a minus value) of the driving thin-film transistor T1, is applied to the driving gate electrode G1 of the driving thin-film transistor T1.

The driving voltage ELVDD and the compensation voltage Dm+Vth are applied at two ends of the storage capacitor Cst, respectively, and an electric charge corresponding to a difference between the voltages at the two ends thereof are stored in the storage capacitor Cst.

During an emission period, the operation control thin-film transistor T5 and the emission control thin-film transistor T6 are turned on in response to the emission control signal En provided from the emission control line 121. The driving current $I_{OLED}$ according to a difference between a voltage of the driving gate electrode G1 of the driving thin-film transistor T1 and the driving voltage ELVDD is generated, and the driving current $I_{OLED}$ is provided to the organic light-emitting device OLED through the emission control thin-film transistor T6.

The display apparatus according to the present exemplary embodiment includes a shielding conductive layer 141 that is connected to the current scanning line 131 and receives a scanning signal. The shielding conductive layer 141 may block a parasitic capacitance that may occur between a portion A in which the data line 151 is arranged, and a portion B that connects the driving thin-film transistor T1 to the compensation thin-film transistor T3. As the scanning signal, which is not a constant voltage but a pulse signal, is applied to the shielding conductive layer 141, a voltage applied to the pixel circuit may be maintained low.

Hereinafter, the display apparatus according to an exemplary embodiment will be described in more detail with reference to layout diagrams and cross-sectional views of FIGS. 4A through 7.

Figure 4A:
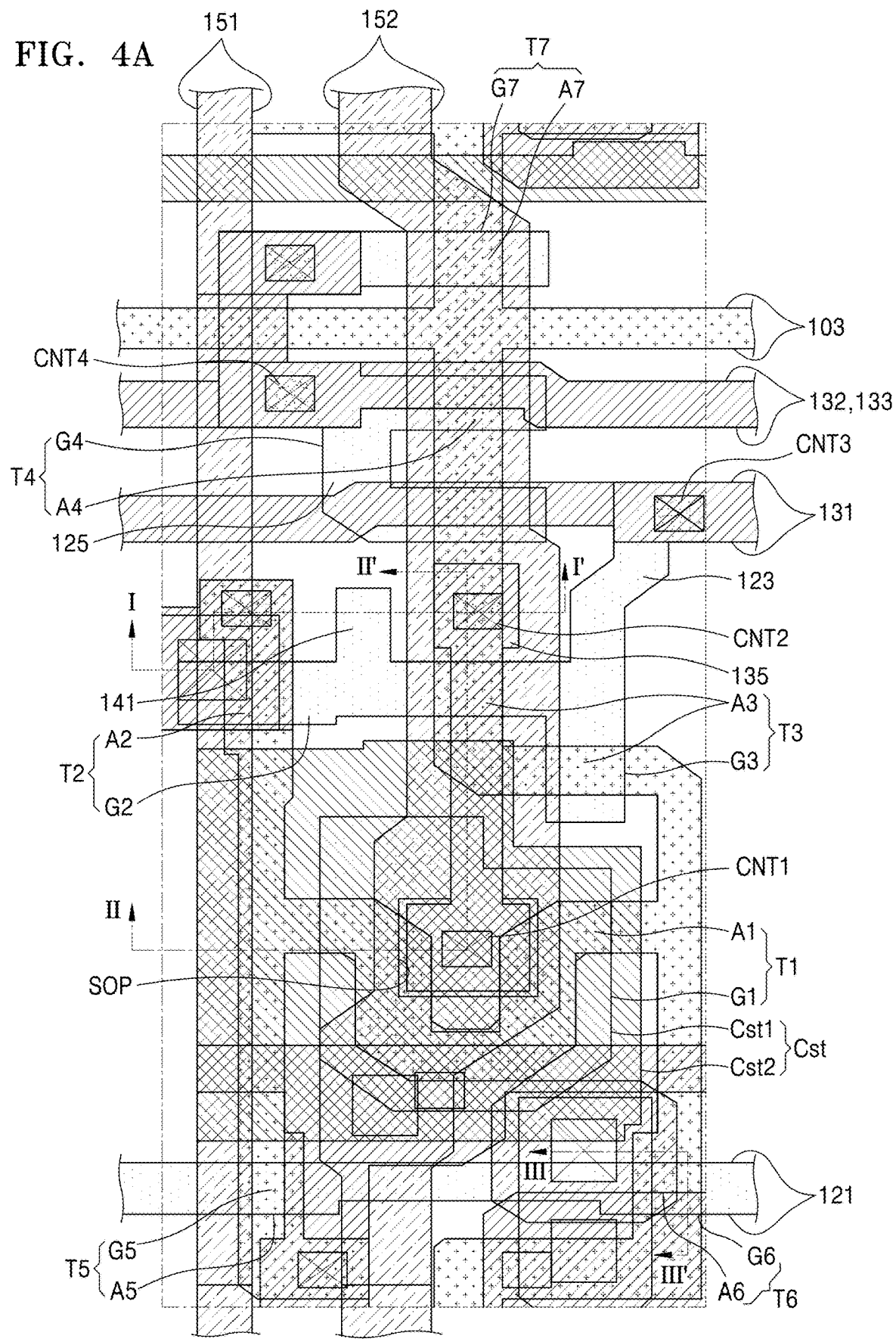
FIG. 4A is a plan view schematically illustrating positions of a plurality of thin-film transistors and a capacitor included in a pixel circuit according to an exemplary embodiment.

FIG. 4A is a layout diagram schematically illustrating positions of the plurality of thin-film transistors and the capacitor in the pixel circuit according to an exemplary embodiment. FIGS. 4B through 4E are schematic layout diagrams showing a configuration shown in FIG. 4A according to layers, respectively.

Figure 5:
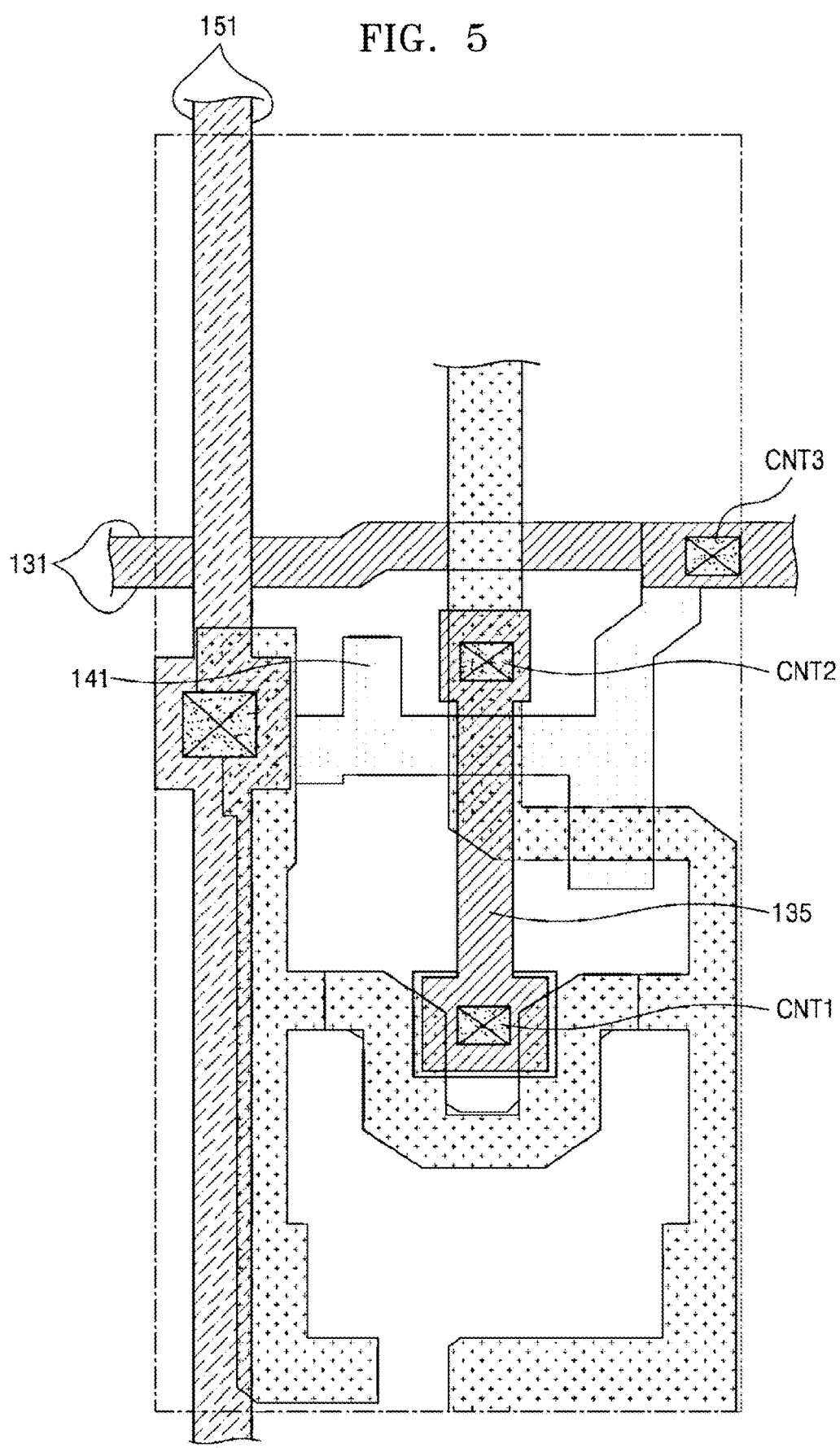
FIG. 5 is a schematic layout diagram showing a part of the configuration of a shielding conductive layer shown in FIG. 4A.
Figure 6:
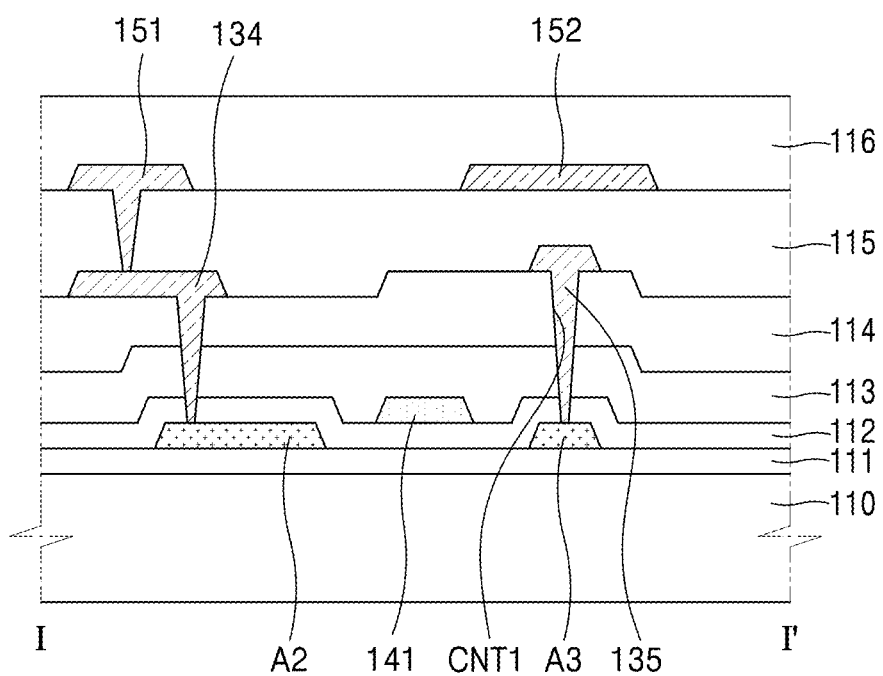
FIG. 6 shows a partial configuration of a cross-sectional view of FIG. 4A, taken along line I-I'.
Figure 7:
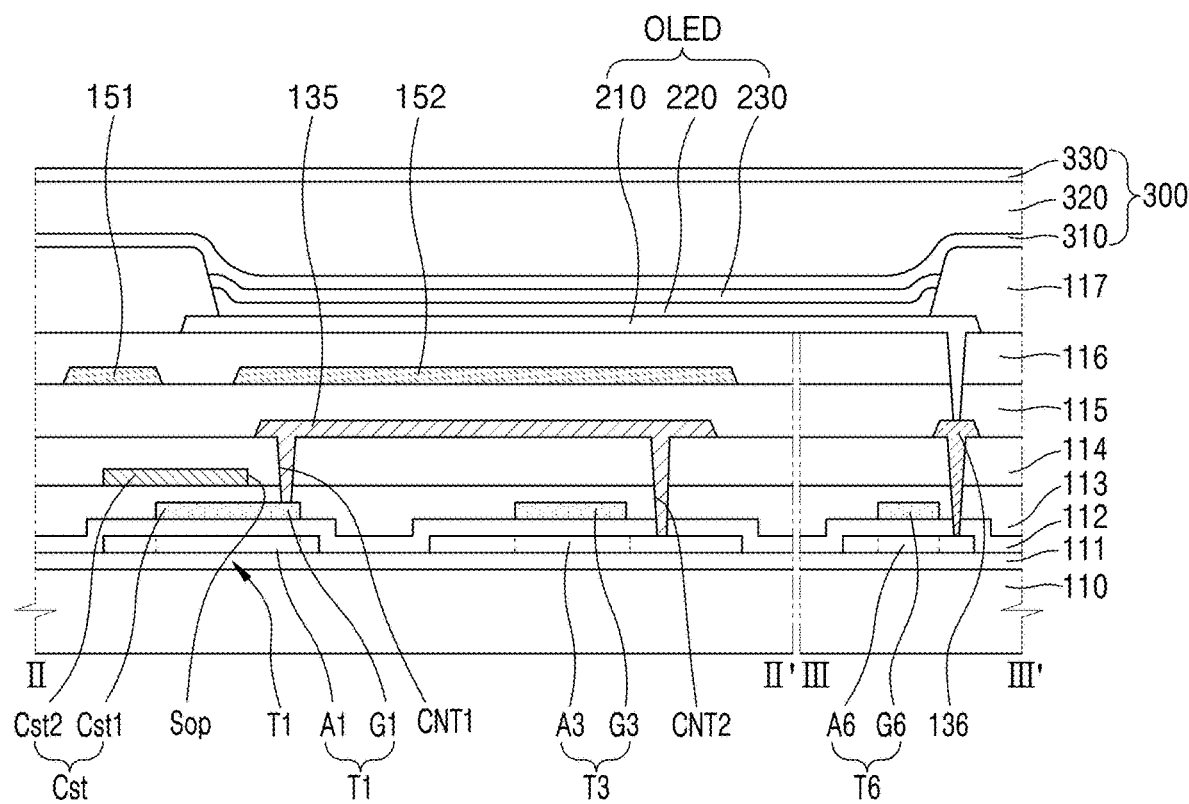
FIG. 7 is a cross-sectional view of FIG. 4A, taken along lines II-II' and III-III', where a configuration in which an organic light-emitting diode is arranged is shown.

FIG. 5 is a schematic layout diagram showing a part of the configuration of a shielding conductive layer shown in FIG. 4A. FIG. 6 shows a partial configuration of a cross-sectional view of FIG. 4A, taken along line I-I'. FIG. 7 is a cross-sectional view of FIG. 4A, taken along lines II-II' and III-III', where a configuration in which an organic light-emitting diode is arranged is shown.

As shown in FIGS. 4A through 5, the display apparatus according to an exemplary embodiment includes the current scanning line 131, the previous scanning line 132, the emission control line 121, and the initialization voltage line 103 that extend in the first direction and includes the data line 151 and the driving voltage line 152 that extends in the second direction which intersects with the first direction.

In an exemplary embodiment, the current scanning line 131 and the previous scanning line 132 may include the same material and be arranged in the same layer. The previous scanning line 132 may be connected to the next scanning line 133 (see FIG. 3) and provide the same signal as that of the next scanning line 133. The current scanning line 131 and the previous scanning line 132 are arranged in a layer different from layers in which the gate electrodes G1 through G7 of the thin-film transistors T1 through T7 are arranged and may each have a resistance less than resistances of the gate electrodes G1 through G7. That is, a specific resistance value of the current scanning line 131 may be less than specific resistance values of the gate electrodes G1 through G7. Accordingly, a RC delay due to application of a scanning signal may be effectively prevented or minimized.

For example, the current scanning line 131 and the previous scanning line 132 may be arranged in a layer directly on an interlayer insulating layer 114, include a conductive material including aluminum (Al), copper (Cu), titanium (Ti), or the like, and include multiple layers or a single layer including the above-mentioned materials. For example, the current scanning line 131 and the previous scanning line 132 may each have a Ti/Al/Ti multiple layer structure.

The gate electrodes G1 through G7 may be arranged on a first gate insulating layer 112 (e.g., arranged between the first gate insulating layer 112 and the buffer layer 111), include molybdenum (Mo), titanium (Ti), or the like, and may include a single layer or multiple layers. For example, the gate electrodes G1 through G7 may be a single Mo layer.

A second gate insulating layer 113 and the interlayer insulating layer 114 may be arranged between the current scanning line 131 and the gate electrodes G1 through G7. That is, the current scanning line 131 and the previous scanning line 132 are arranged on a layer different from the layer on which the gate electrodes G1 through G7 are arranged, and the current scanning line 131 and the previous scanning line 132 may be connected to the gate electrodes G1 through G7 via contact holes.

Furthermore, the emission control line 121 may include the same material as the gate electrodes G1 through G7 and be arranged on the second gate insulating layer 113, which is the same layer on which the gate electrodes G1 through G7 are arranged. That is, the emission control line 121 may be in the same layer with the gate electrodes G1 through G7.

The data line 151 and the driving voltage line 152 may be arranged between the current scanning line 131 and planarization layer 116. The specific resistance values of the data line 151 and the driving voltage line 152 may be similar to the specific resistance value of the current scanning line 131. For example, the data line 151 and the driving voltage line 152 may include conductive materials including Al, Cu, or Ti and include multiple layers or a single layer including the above-mentioned materials. For example, the data line 151 and the driving voltage line 152 may have a Ti/Al/Ti multi-layer structure.

In addition, the display apparatus according to an exemplary embodiment includes the driving thin-thin-film transistor T1, the switching thin-film transistor T2, the compensation thin-film transistor T3, the first initialization thin-film transistor T4, the operation control thin-film transistor T5, the emission control thin-film transistor T6, the second initialization thin-film transistor T7, and the storage capacitor Cst.

A driving semiconductor layer A1 of the driving thin-film transistor T1, a switching semiconductor layer A2 of the switching thin-film transistor T2, a compensation semiconductor layer A3 of the compensation thin-film transistor T3, a first initialization semiconductor layer A4 of the first initialization thin-film transistor T4, an operation control semiconductor layer A5 of the operation control thin-film transistor T5, an emission control semiconductor layer A6 of the emission control thin-film transistor T6, and a second initialization semiconductor layer A7 of the second initialization thin-film transistor T7 are arranged in the same layer and include the same material. For example, the semiconductor layers A1 through A7 may include polycrystalline silicon. In addition, the semiconductor layers A1 through A7 may be connected to one another and bent in various shapes.

The semiconductor layers A1 through A7 may each include a channel area and a source area and a drain area at two sides of the channel area. For example, the source area and the drain area may be doped with impurities, and the impurities may include an N-type impurity or a P-type impurity. The source area and the drain area correspond to the source electrode and the drain electrode, respectively. Hereinafter, the terms "source area" and "drain area" will be used in place of the terms "source electrode" and "drain electrode".

The driving thin-film transistor T1 includes the driving semiconductor layer A1, the driving gate electrode G1, a driving source area S1, and a driving drain area D1. The driving semiconductor layer A1 is bent. The storage capacitor Cst is formed on the driving thin-film transistor T1 to overlap the driving thin-film transistor T1.

The driving semiconductor layer A1 includes a driving channel area and the driving source area S1 and the driving drain area D1 at two sides of the driving channel area. The driving semiconductor layer has a bent shape and may thus be longer than other semiconductor layers A2 through A7. For example, as the driving semiconductor layer A1 has a shape that is bent at several places, like an omega "Ω" or alphabet "S" shape, the driving semiconductor layer A1 may have a great channel length in a narrow space (See FIG. 4B). As the driving semiconductor layer A1 is long, a driving range of a gate voltage applied to the driving gate electrode G1 increases. Therefore, a grayscale of light emitted from the organic light-emitting device OLED may be more precisely controlled, and display quality may be improved.

The storage capacitor Cst includes the lower electrode Cst1 and the upper electrode Cst2 arranged with the second gate insulating layer 113 therebetween. Here, the driving gate electrode G1 also functions as the lower electrode Cst1. That is, the driving gate electrode G1 is integrally formed with the lower electrode Cst1. The second gate insulating layer 113 functions as a dielectric of the storage capacitor Cst, and a storage capacitance is determined by an electric charge stored in the storage capacitor Cst and a voltage between the lower electrode Cst1 and the upper electrode Cst2.

Figure 4B:
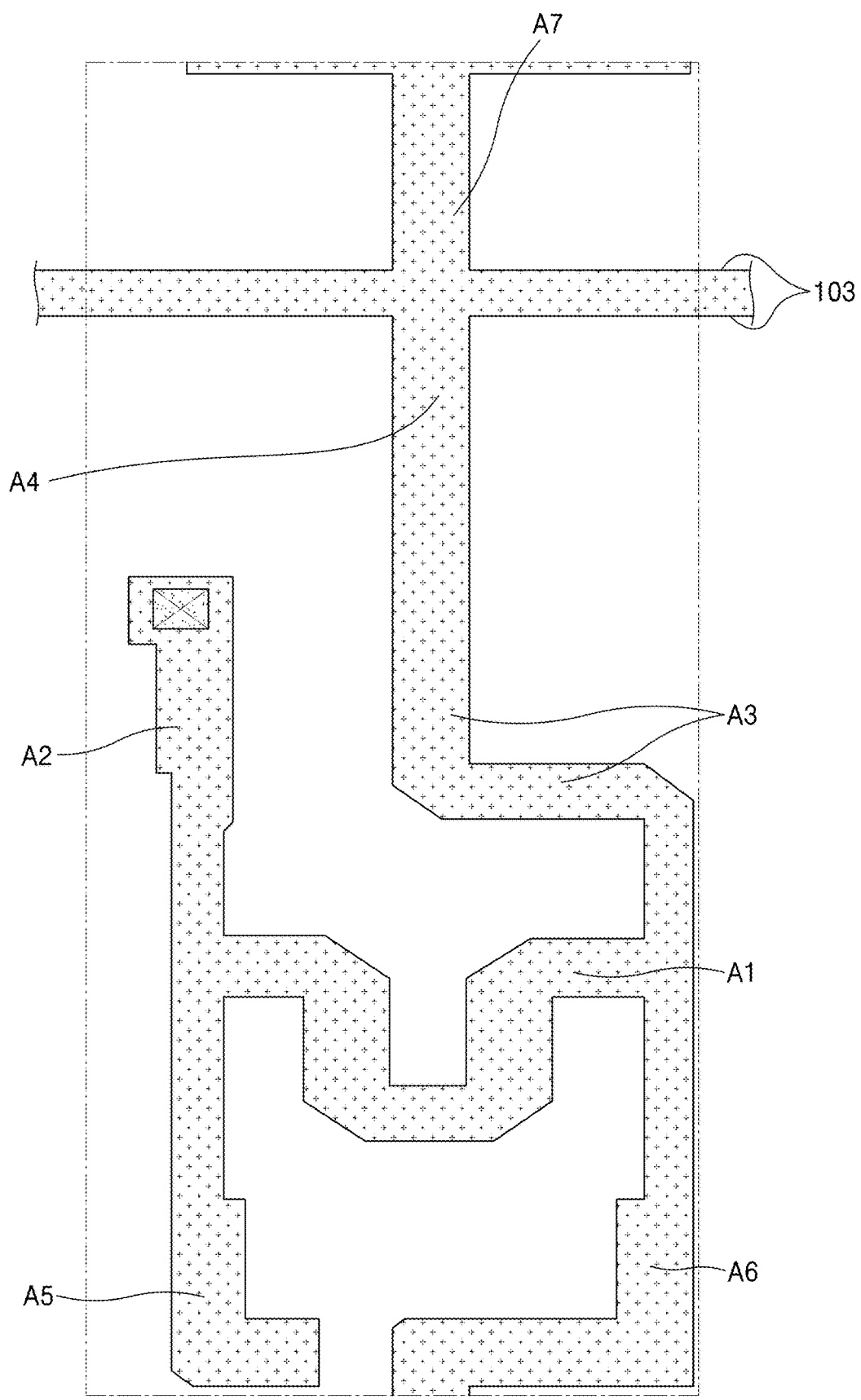
FIGS. 4B through 4E are schematic layout diagrams respectively showing a configuration shown in FIG. 4A according to layers.
Figure 4C:
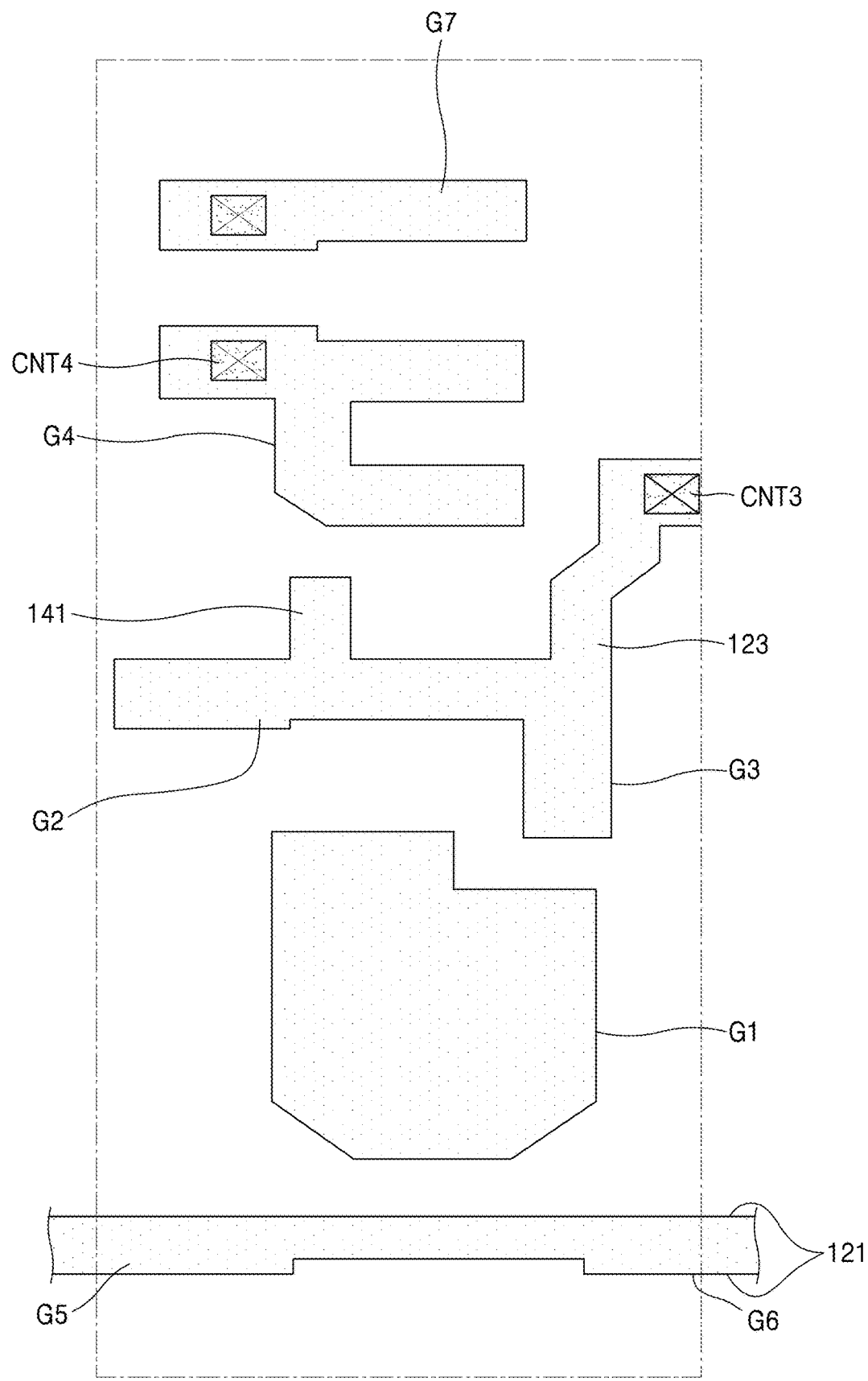
Figure 4D:
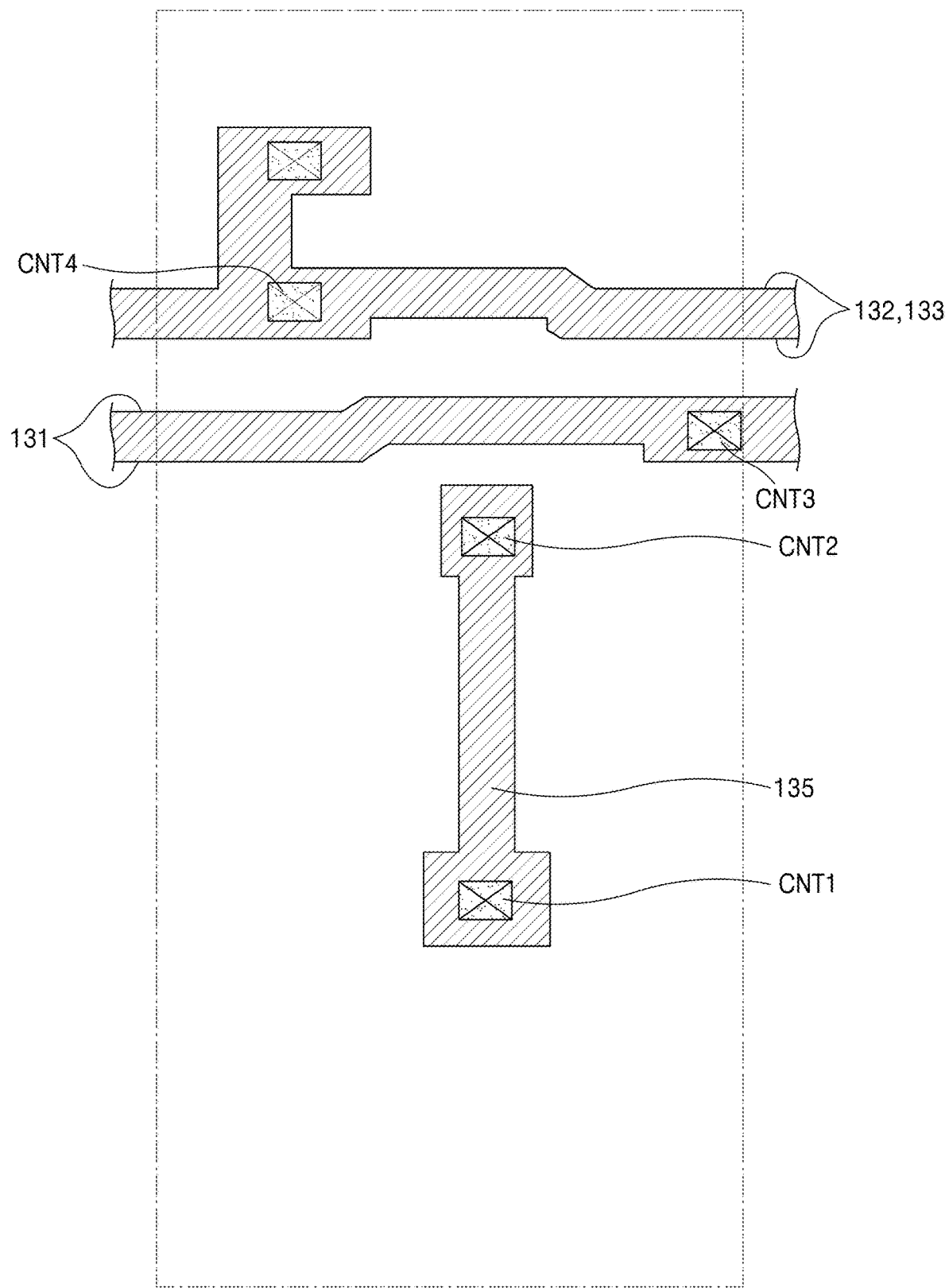
Figure 4E:
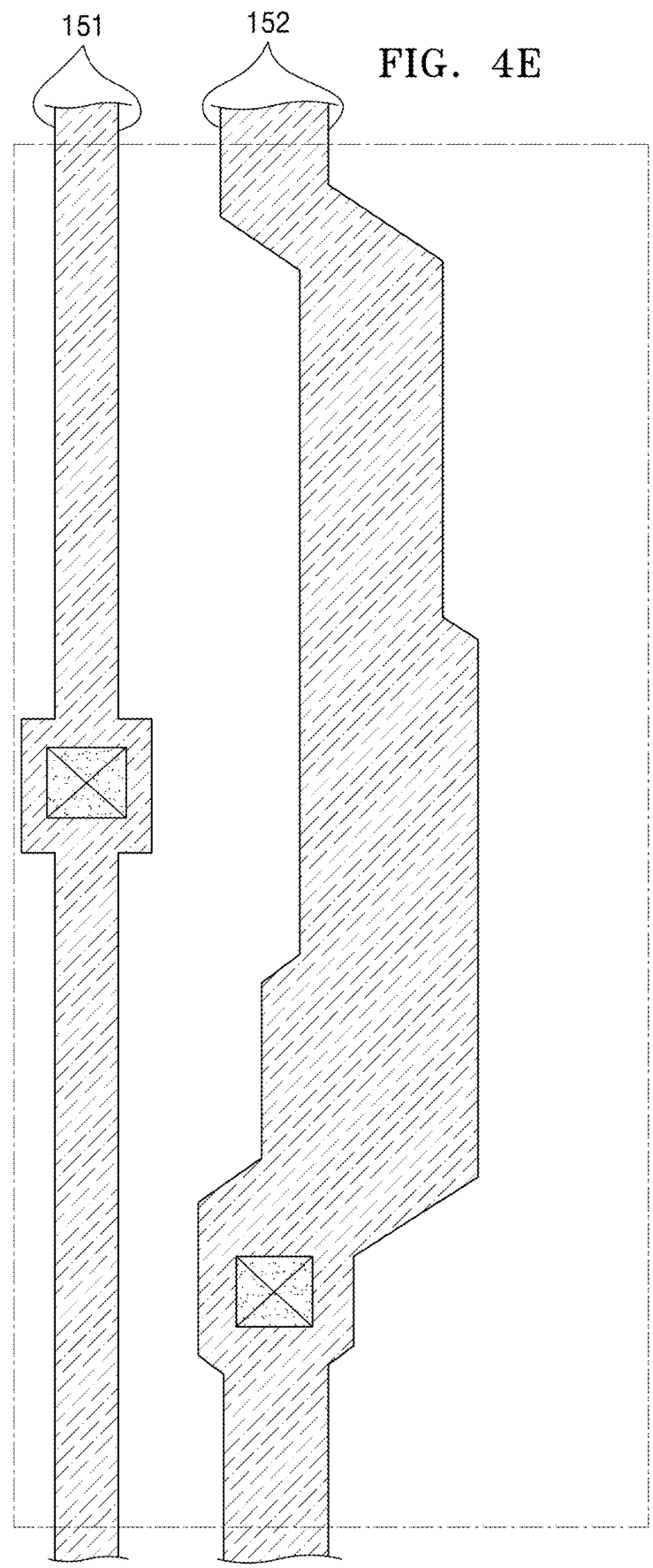

The lower electrode Cst1 is a floating electrode having the form of an island and includes the same material and arranged in the same layer as the emission control line 121, the switching gate electrode G2, the compensation gate electrode G3, the first initialization gate electrode G4, the operation control gate electrode G5, the emission control gate electrode G6, and the second initialization gate electrode G7 (See FIG. 4C).

The upper electrode Cst2 is arranged on the second gate insulating layer 113. The upper electrode Cst2 defines a storage opening SOP. The area covered by the upper electrode Cst2 and the storage opening SOP overlaps an entire portion of the lower electrode Cst1. The storage opening SOP may have the form of a closed curve that penetrates the upper electrode Cst2. Here, a simple closed curve indicates a closed shape in which a starting point is the same as an ending point when a point is drawn on a straight line or a curve, for example, a polygon or a circle. The upper electrode Cst2 is connected to the driving voltage line 152 via a contact hole and receives the driving power voltage ELVDD.

The switching thin-film transistor T2 includes the switching semiconductor layer A2 and the switching gate electrode G2. The switching semiconductor layer A2 includes a switching source electrode S2 and a switching drain area D2 at two sides of a switching channel area. The switching drain area D2 is connected to the driving source area S1.

The compensation thin-film transistor T3 includes the compensation semiconductor layer A3 and the compensation gate electrode G3. The compensation semiconductor layer A3 includes a compensation source area S3 and a compensation drain area D3 at two sides of compensation channel areas. The compensation thin-film transistor T3 formed by the compensation semiconductor layer A3 is a dual thin-film transistor including two compensation channel areas. An area between the compensation channel areas is an area doped with impurities and is partially a source area of one channel area of the dual thin-film transistor and a drain area of the other channel area of the dual thin-film transistor. The compensation drain area D3 may be connected to the lower electrode Cst1 through a node connection line 135. The compensation gate electrode G3 may form an extra dual gate electrode to prevent a leakage current.

The first initialization thin-film transistor T4 includes the first initialization semiconductor layer A4 and the first initialization gate electrode G4. The first initialization semiconductor layer A4 includes a first initialization source area S4 and a first initialization drain area D4 at two sides of a first initialization channel area. The first initialization thin-film transistor T4 formed by the first initialization semiconductor layer A4 is a dual thin-film transistor including two first initialization channel areas A4. An area between the first initialization channel areas is an area doped with impurities and is partially a source area of one channel area of the dual thin-film transistor and a drain area of the other channel area of the dual thin-film transistor. The first initialization drain area may D4 be connected to the lower electrode Cst1 through the node connection line 135. The first initialization source area S4 may be connected to the initialization voltage line 103.

The operation control thin-film transistor T5 includes the operation control semiconductor layer A5 and the operation control gate electrode G5. The operation control semiconductor layer A5 includes an operation control source area S5 and an operation control drain area D5 at two sides of an operation control channel area. The operation control drain area D5 may be connected to the driving source area S1.

The emission control thin-film transistor T6 includes the emission control semiconductor layer A6 and the emission control gate electrode G6. The emission control semiconductor layer A6 includes an emission control source area S6 and an emission control drain area D6 at two sides of an emission control channel area. The emission control source area S6 may be connected to the driving drain area D1.

The second initialization thin-film transistor T7 includes the second initialization semiconductor layer A7 and the second initialization gate electrode G7. The second initialization semiconductor layer A7 includes a second initialization source area S7 and a second initialization drain area D7 at two sides of a second initialization channel area.

The initialization voltage line 103 may include the same material and be arranged in the same layer as the semiconductor layers A1 through A7 (See FIG. 4B). The initialization voltage line 103 may be connected to the first initialization source area S4 of the first initialization thin-film transistor T4 and the second initialization source area S7 of the second initialization thin-film transistor T7.

An end of the driving semiconductor layer A1 of the driving thin-film transistor T1 is connected to the switching semiconductor layer A2 and the operation control semiconductor layer A5, and the other end of the driving semiconductor layer A1 is connected to the compensation semiconductor layer A3 and the emission control semiconductor layer A6. Accordingly, the driving source area S1 is connected to the switching drain area D2 and the operation control drain area D5, and the driving drain area D1 is connected to the compensation source area S3 and the emission control source area S6.

The lower electrode Cst1 of the storage capacitor Cst is connected to the compensation thin-film transistor T3 and the first initialization thin-film transistor T4 through the node connection line 135. The node connection line 135 is disposed in the same layer as the current scanning line 131 (See FIG. 4D). An end of the node connection line 135 is connected to the lower electrode Cst1 through a first node contact hole CNT1 defined in the second gate insulating layer 113 and an interlayer insulating layer 114. Here, the first node contact hole CNT1 is arranged in a storage opening SOP defined by the upper electrode Cst2. As a size of the storage opening SOP is greater than a size of the first node contact hole CNT1, the first node contact hole CNT1 may be in contact with the lower electrode Cst1 without being in contact with the upper electrode Cst2.

The other end of the node connection line 135 is connected to the compensation drain area D3 and the first initialization drain area D4 through a node contact hole CNT2 defined in the first gate insulating layer 112, the second gate insulating layer 113, and the interlayer insulating layer 114.

The upper electrode Cst2 of the storage capacitor Cst is connected to the driving voltage line 152 through a contact hole defined in the interlayer insulating layer 114 and receives the driving power voltage ELVDD from the driving voltage line 152.

In addition, the switching thin-film transistor T2 is used as a switching device for selecting a pixel to emit light. The switching gate electrode G2 is connected to the current scanning line 131 arranged on a different layer from the layer the switching gate electrode G2 is arranged through a contact hole, the switching source area S2 is connected to the data line 151 through a contact hole, and the switching drain area D2 is connected to the driving thin-film transistor T1 and the operation control thin-film transistor T5.

The emission control drain area D6 of the emission control thin-film transistor T6 may be directly connected to the pixel electrode of the organic light-emitting diode OLED through a via hole defined in the via layer 115 and a planarization layer 116.

The display apparatus according to the present exemplary embodiment includes a shielding conductive layer 141 for reducing a parasite capacitance. The shielding conductive layer 141 may extend from a first gate electrode layer 123 that is connected to the current scanning line 131 through a third contact hole CNT3 (See FIG. 5). In other words, it may be understood that the shielding conductive layer 141 is integrally formed with the first gate electrode layer 123.

The first gate electrode layer 123 may include the compensation gate electrode G3 of the compensation thin-film transistor T3 and the switching gate electrode G2 of the switching thin-film transistor T2. The shielding conductive layer 141 may be arranged between the switching gate electrode G2 and the compensation gate electrode G3. In other words, as the first gate electrode layer 123 is connected to the current scanning line 131 through the contact hole CNT3, the scanning signal Sn (see FIG. 3) that is a pulse signal may be provided to the shielding conductive layer 141.

Referring to FIGS. 5 and 6, which are a schematic view of a configuration at a periphery of the shielding conductive layer 141 and a cross-sectional view of the periphery of the shielding conductive layer 141, respectively, in a plan view, the shielding conductive layer 141 is arranged between the data line 151 and the node connection line 135. The shielding conductive layer 141, the data line 151, and the node connection line 135 all extend in the second direction.

The shielding conductive layer 141 may be arranged on the first gate insulating layer 112 and in the same layer as the gate electrodes G1 through G7. The shielding conductive layer 141 may be arranged between the switching thin-film transistor T2 and the compensation thin-film transistor T3. In addition, the data line 151 may be connected to the switching semiconductor layer A2 of the switching thin-film transistor T2 through a connection electrode 134.

When a display apparatus does not include the shielding conductive layer 141, a parasitic capacitance may be generated between the data line 151 and the node connection line 135, and thus, properties of the driving thin-film transistor T1 or the like may be changed according to signal provision of the data line 151.

However, as the display apparatus according to the present exemplary embodiment includes the shielding conductive layer 141, generation of the parasitic capacitance may be effectively prevented. In addition, as the shielding conductive layer 141 receives the scanning signal Sn, which is a pulse signal, and is linked to the scanning signal Sn, coupling influence due to the signal from the data line 151 may be minimized.

Hereinafter, the configurations included in the display apparatus of an exemplary embodiment will be described according to stacking order. FIG. 7 shows a configuration in which the organic light-emitting diode OLED is arranged on a cross-section of FIG. 4A taken along lines II-II' and III-III'.

The substrate 110 may include a glass material, a ceramic material, a metal material, or a flexible or bendable material. When the substrate 110 is flexible or bendable, the substrate 110 may include a polymer resin such as polyethersulphone, polyacrylate, polyetherimide, polyethylene naphthalate, polyethylene terephthalate, polyphenylene sulfide, polyarylate, polyimide, polycarbonate, or cellulose acetate propionate, for example. The substrate 110 may have a single layer or multi-layer structure including the above-mentioned materials, and in the case of a multi-layer structure, the substrate 110 may further include an inorganic layer. In some exemplary embodiments, the substrate 110 may have a structure including an organic material/inorganic material/organic material.

The buffer layer 111, which is on the substrate 110, may reduce or prevent permeation of foreign materials, moisture, or external air from a bottom portion of the substrate 110 and provide a planarized surface on the substrate 110. The buffer layer 111 may include an inorganic material such as an oxide or a nitride, an organic material, or an organic-inorganic complex material, for example, and may include a single layer or a multi-layer structure including an inorganic material and an organic material.

A barrier layer (not shown) may be further included between the substrate 110 and the buffer layer 111. The barrier layer may prevent or minimize impurities from the substrate 110, or the like, from permeating into the semiconductor layers A1 through A7. The barrier layer may include an inorganic material such as an oxide or a nitride, an organic material, or an organic-inorganic complex material, and may include a single layer or a multi-layer structure including an inorganic material and an organic material.

The semiconductor layers A1, A3, and A6 may be arranged on the buffer layer 111. The semiconductor layers A1, A3, and A6 may include amorphous silicon or polysilicon. In another exemplary embodiment, the semiconductor layer A1 may include an oxide of at least one of indium (In), gallium (Ga), stannum (Sn), hafnium (Hf), cadmium (Cd), germanium (Ge), chromium (Cr), titanium (Ti), aluminum (Al), cesium (Cs), cerium (Ce), and zinc (Zn). In some exemplary embodiments, the semiconductor layer A1 may include a Zn oxide-based material, for example, a Zn oxide, an In—Zn oxide, a Ga—In—Zn oxide, or the like. In another exemplary embodiment, the semiconductor layer A1 may include an In—Ga—Zn—O ("IGZO") semiconductor, an In—Sn—Zn—O ("ITZO") semiconductor, or an In—Ga—Sn—Zn—O ("IGTZO") semiconductor including metals such as In, Ga, or Sn in ZnO. The semiconductor layers A1, A3, and A6 may include a channel area and a source area and a drain area arranged at two sides of the channel area. The semiconductor layers A1, A3, and A6 may each include a single layer or multiple layers.

On the semiconductor layers A1, A3, and A6, the gate electrodes G1, G3, and G6 are arranged to at least partially overlap the semiconductor layers A1, A3, and A6, respectively, with the first gate insulating layer 112 therebetween. The gate electrodes G1, G3, and G6 may include Mo, Al, Cu, Ti, or the like and include a single layer or multiple layers. For example, the gate electrodes G1, G3, and G6 may each include a single Mo layer.

The first gate insulating layer 112 may include silicon dioxide ($SiO_2$), silicon nitride ($SiN_x$), silicon oxynitride (SiON), aluminum oxide ($Al_2O_3$), titanium dioxide ($TiO_2$), tantalum oxide ($Ta_2O_5$), hafnium oxide ($HfO_2$), zinc oxide ($ZnO_2$), or the like.

The second gate insulating layer 113 may be provided to cover the gate electrodes G1, G3, and G6. The second gate insulating layer 113 may include $SiO_2$, $SiN_x$, SiON, $Al_2O_3$, $TiO_2$, $Ta_2O_5$, $HfO_2$, $ZnO_2$, or the like.

The lower electrode Cst1 of the storage capacitor Cst may overlap the driving thin-film transistor T1. For example, the driving gate electrode G1 of the driving thin-film transistor T1 may function as the lower electrode Cst1 of the storage capacitor Cst.

The upper electrode Cst2 of the storage capacitor Cst overlaps the lower electrode Cst1 with the second gate insulating layer 113 therebetween. In this case, the second gate insulating layer 113 may function as a dielectric layer of the storage capacitor Cst. The upper electrode Cst2 may include a conductive material including Mo, Al, Cu, Ti, or the like and may include multiple layers or a single layer including the above-mentioned materials.

The interlayer insulating layer 114 may be provided to cover the upper electrode Cst2 of the storage capacitor Cst. The interlayer insulating layer 114 may include $SiO_2$, $SiN_x$, SiON, $Al_2O_3$, $TiO_2$, $Ta_2O_5$, $HfO_2$, $ZnO_2$, or the like.

The node connection line 135 is arranged on the interlayer insulating layer 114. The node connection line 135 may include a conductive material including aluminum (Al), copper (Cu), titanium (Ti), or the like and may include multiple layers or a single layer including the above-mentioned materials. For example, the node connection line 135 may have a Ti/Al/Ti multiple layer structure.

An end of the node connection line 135 may be connected to the driving gate electrode G1 via the first node contact hole CNT1 that penetrates the interlayer insulating layer 114 and the second gate insulating layer 113, and the other end of the node connection line 135 may be connected to the compensation semiconductor layer A3 through the second node contact hole CNT2 that penetrates the interlayer insulating layer 114, the second gate insulating layer 113, and the first gate insulating layer 112.

The via layer 115 may be on the node connection line 135 and a connection electrode 136, and the data line 151 and the driving voltage line 152 may be on the via layer 115.

The via layer 115 may include, for example, a general commercial polymer like benzocyclobutene ("BCB"), polyimide, hexamethyldisiloxane ("HMDSO"), polymethylmethacrylate ("PMMA"), and polystyrene ("PS"), a polymer derivative having a phenolic group, an acryl-based polymer, an imide-based polymer, an aryl ether-based polymer, an amide-based polymer, a fluoride-based polymer, a p-xylene-based polymer, a vinyl alcohol-based polymer, a blend thereof, or the like. The via layer 115 may include an inorganic material. The via layer 115 may include $SiO_2$, $SiN_x$, SiON, $Al_2O_3$, $TiO_2$, $Ta_2O_5$, $HfO_2$, $ZnO_2$, or the like, for example. When the via layer 115 includes an inorganic material, chemical planarization polishing may be performed. In addition, the via layer 115 may include an organic material and an inorganic material.

The data line 151 and the driving voltage line 152 are arranged on the via layer 115. The data line 151 and the driving voltage line 152 may each include a conductive material including Al, Cu, Ti, or the like and may include multiple layers or a single layer including the above-mentioned materials.

The planarization layer 116 is on the data line 151 and the driving voltage line 152. The planarization layer 116 may include an organic material such as acryl, BCB, polyimide ("PI"), or HMDSO. Alternatively, the planarization layer 116 may include an inorganic material. The planarization layer 116 may generally planarize an upper portion of a protective layer that covers the thin-film transistors T1 through T7. The planarization layer 116 may include a single layer or multiple layers.

The organic light-emitting diode OLED including a pixel electrode 210, an opposite electrode 230, and an intermediate layer 220 located therebetween and including an emission layer may be arranged on the planarization layer 116.

The pixel electrode 210 is connected to the connection electrode 136 through a via hole, penetrates the planarization layer 116 and the via layer 115, and is connected to the emission control drain area D6 of the emission control thin-film transistor T6 via the connection electrode 136.

A pixel defining layer 117 may be arranged on the planarization layer 116. The pixel defining layer 117 defines pixels by an opening corresponding to each sub pixels. That is, an opening exposes at least a center portion of the pixel electrode 210. The pixel defining layer 117 also prevents occurrence of arcs or the like at the edges of the pixel electrode 210, by increasing distances between the edges of the pixel electrode 210 and the opposite electrode 230 above the pixel electrode 210. The pixel defining layer 117 may include an organic material, for example, PI, HMDSO, or the like.

The intermediate layer 220 of the organic light-emitting diode OLED may include a low molecular weight material or a polymer material. When the intermediate layer 220 includes a low molecular weight material, a hole injection layer ("HIL"), an emission layer ("EML"), an electron transport layer ("ETL"), an electron injection layer ("EL"), or the like may have a single-layer structure or a multi-layer stack structure, and the low molecular weight material may include various organic materials such as copper phthalocyanine ("CuPc"), N, N'-Di(Naphthalene-1-yl)-N,N'-diphenyl-benzidine ("NPB"), and tris-8-hydroxyquinoline aluminum ("Alq3"), for example. Such layers may be formed by a vacuum deposition method.

When the intermediate layer 220 includes a polymer material, the intermediate layer 220 may typically have a structure including an HTL and an EML. In this case, the HTL may include poly(3,4-ethylenedioxythiophene) ("PEDOT"), and the EML may include a polymer material such as a poly-phenylenevinylene ("PPV")-based material and polyfluorene, for example. The intermediate layer 220 may be formed by using a screen printing method, an inkjet printing method, a laser induced thermal imaging ("LITI") method, or the like.

However, the intermediate layer 220 is not limited thereto and may have various structures. In addition, the intermediate layer 220 may include a layer integrally formed over a plurality of pixel electrodes 210 and may also include a layer that is patterned to correspond to each of the plurality of pixel electrodes 210.

The opposite electrode 230 may be arranged in the display area DA to cover the display area DA. That is, the opposite electrode 230 may be integrally formed over a plurality of organic light-emitting diodes OLED to correspond to the plurality of pixel electrodes 210.

As the organic light-emitting diode OLED may be easily damaged due to moisture or oxygen from the outside, a thin-film encapsulation layer 300 may cover the organic light-emitting diodes OLED for protection. The thin-film encapsulation layer 300 may cover the display area DA and extend to an outer area of the display area DA. The thin-film encapsulation layer 300 may include a first inorganic encapsulation layer 310, an organic encapsulation layer 320, and a second inorganic encapsulation layer 330.

The first inorganic encapsulation layer 310 may cover the opposite electrode 230 and include ceramic, a metal oxide, a metal nitride, a metal carbide, a metal oxynitride, indium oxide ($In_2O_3$), tin oxide ($SnO_2$), indium tin oxide ("ITO"), silicon oxide, silicon nitride and/or silicon oxynitride, or the like, for example. Other layers such as a capping layer (not shown) may be located as needed between the first inorganic encapsulation layer 310 and the opposite electrode 230. As the first inorganic encapsulation layer 310 is provided along a structure located thereunder, an upper surface of the first inorganic encapsulation layer 310 is not even.

The organic encapsulation layer 320 covers the first inorganic encapsulation layer 310, and unlike the first inorganic encapsulation layer 310, the organic encapsulation layer 320 may have an upper surface that is approximately even. More particularly, the upper surface of the organic encapsulation layer 320 may be approximately even in a portion corresponding to the display area DA. The organic encapsulation layer 320 may include at least one material selected from the group consisting of acryl, metacrylic, polyester, polyethylene, polypropylene, polyethylene terephthalate, polyethylene naphthalate, polycarbonate, polyimide, polyethylene sulfonate, polyoxymethylene, polyarylate, and hexamethyldisiloxane, for example.

The second inorganic encapsulation layer 330 may cover the organic encapsulation layer 320 and include ceramic, a metal oxide, a metal nitride, a metal carbide, a metal oxynitride, $In_2O_3$, $SnO_2$, ITO, silicon oxide, silicon nitride and/or silicon oxynitride, or the like, for example.

As described above, the thin-film encapsulation layer 300 includes the first inorganic encapsulation layer 310, the organic encapsulation layer 320, and the second inorganic encapsulation layer 330. By using this multi-layer structure, even when cracks occur in the thin-film encapsulation layer 300, between the first inorganic encapsulation layer 310 and the organic encapsulation layer 320 or between the organic encapsulation layer 320 and the second inorganic encapsulation layer 330 connection of such cracks may be prevented. By doing so, formation of a path through which external moisture or oxygen permeates into the display area DA may be prevented or minimized.

Although not shown, a spacer for preventing imprinting of the mask may be further provided on the pixel defining layer 117, and various functional layers such as a polarization layer, a black matrix, a color filter, and/or a touch screen layer including a touch electrode, which are to reduce reflection of external light, may be provided on the thin-film encapsulation layer 300.

Figure 8:
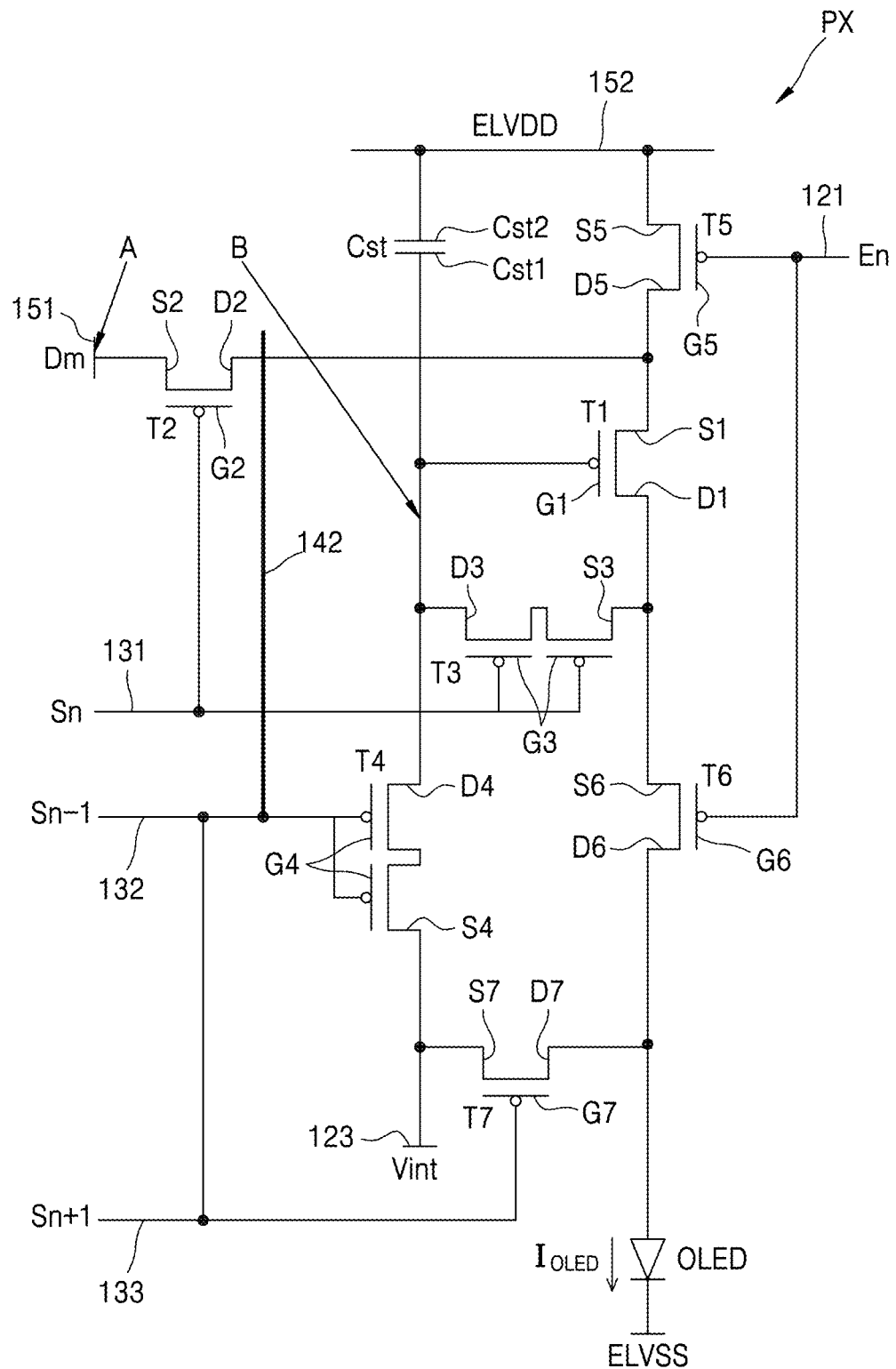
FIG. 8 is another exemplary embodiment of an equivalent circuit diagram of a pixel included in the display apparatus shown in FIG. 1.
Figure 9:
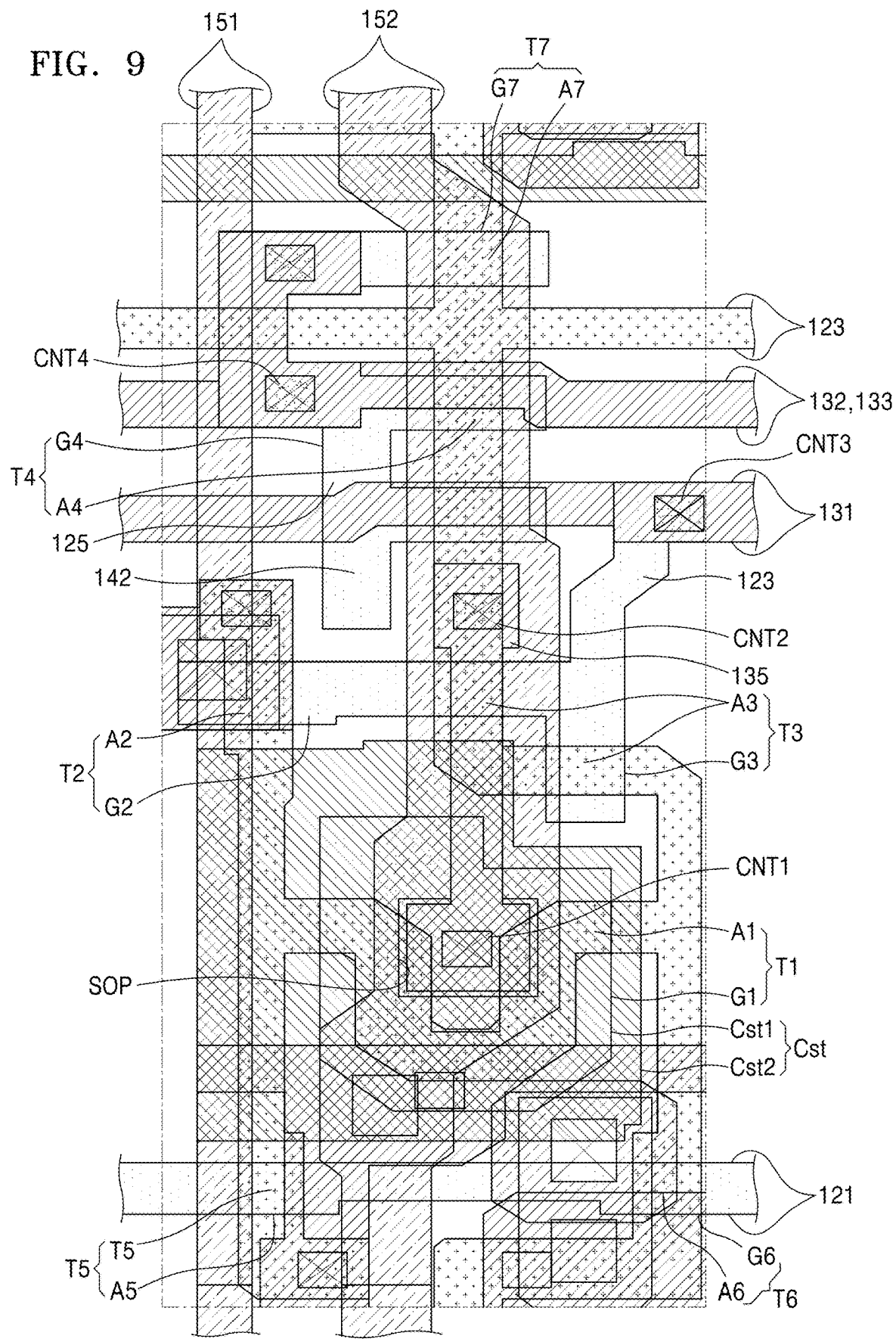
FIG. 9 is a layout diagram schematically illustrating positions of a plurality of thin-film transistors and a capacitor included in a pixel circuit according to an exemplary embodiment.

FIG. 8 is an equivalent circuit diagram of a pixel according to another exemplary embodiment, and FIG. 9 is a plan view schematically illustrating positions of a plurality of thin-film transistors and a capacitor included in the pixel circuit in FIG. 8. In FIGS. 8 and 9, same reference numerals as those of FIGS. 3 and 4 denote same members as those of FIGS. 3 and 4, and therefore, repeated descriptions will be omitted.

Referring to FIG. 8, the pixel PX includes the signal lines 121, 122, 123, and 151, the plurality of thin-film transistors T1, T2, T3, T4, T5, T6, and T7 connected to the signal lines 121, 122, 123, and 151, the capacitor Cst, the initialization voltage line 103, the driving voltage line 152, and the organic light-emitting device OLED.

In the present exemplary embodiment, the shielding conductive layer 142 connected to the previous scanning line 132 may be arranged between portion A, in which the data line 151 is arranged, and portion B that connects the driving thin-film transistor T1 to the compensation thin-film transistor T3. The shielding conductive layer 142 is connected to the previous scanning line 132 and may receive the previous scanning signal Sn−1.

The shielding conductive layer 142 may be used for preventing a parasitic capacitance that may occur between the portion A and portion B.

Referring to FIG. 9, the shielding conductive layer 142 extends in the second direction, and in a top-plan view, the shielding conductive layer 142 is arranged between the data line 151 and the node connection line 135. As the node connection line 135 overlaps the driving voltage line 152, the shielding conductive layer 142 may be understood as being arranged between the data line 151 and the driving voltage line 152.

In the present exemplary embodiment, the shielding conductive layer 142 may extend from the second gate electrode layer 125 that is connected to the previous scanning line 132 through a fourth contact hole CNT4. The second gate electrode layer 125 may be the first initialization gate electrode G4 of the first initialization thin-film transistor T4. The first initialization gate electrode G4 may be bent twice and overlap the first initialization semiconductor layer A4 twice. For example, the first initialization gate electrode G4 may have the form of letter 'C'. The first initialization gate electrode G4 may be a dual gate electrode, and the first initialization thin-film transistor T4 may be a dual thin-film transistor.

The shielding conductive layer 142 may be arranged between the data line 151 and the node connection line 135 to prevent occurrence of parasitic capacitance. In addition, the shielding conductive layer 142 receives the previous scanning signal Sn−1, which is a pulse signal, and is linked with the previous scanning signal Sn−1. Therefore, coupling influence due to the signal from the data line 151 may be minimized.

As described above, in an exemplary embodiment, the shielding conductive layer that is arranged in the same layer as the gate electrode is arranged between the node connection line, which connects the driving thin-film transistor with the compensation thin-film transistor, and the data line. Accordingly, crosstalk due to the parasitic capacitance may be reduced.

In addition, as the scanning line that has a resistance lower than a resistance of the gate electrode of the switching thin-film transistor, RC delay may be prevented.

It should be understood that exemplary embodiments described herein should be considered in a descriptive sense only and not for purposes of limitation. Descriptions of features or aspects within each exemplary embodiment should typically be considered as available for other similar features or aspects in other exemplary embodiments. While one or more exemplary embodiments have been described with reference to the figures, it will be understood by those of ordinary skill in the art that various changes in form and details may be made therein without departing from the spirit and scope as defined by the following claims.

What is claimed is:

1. A display apparatus comprising:
a substrate;
a driving thin-film transistor arranged on the substrate and comprising a driving semiconductor layer and a driving gate electrode;
a first scanning line arranged on the substrate and which extends in a first direction;
a data line which extends in a second direction that intersects with the first direction;
a node connection line arranged in a same layer as the first scanning line; and
a shielding conductive layer arranged between the data line and the node connection line and disposed in a same layer as the driving gate electrode,
wherein an end of the node connection line is connected to the driving gate electrode through a first node contact hole.

2. The display apparatus of claim 1, further comprising a first gate electrode layer connected to the first scanning line through a third contact hole,
wherein the shielding conductive layer extends from the first gate electrode layer.

3. The display apparatus of claim 2, wherein the shielding conductive layer and the node connection line extend in the second direction.

4. The display apparatus of claim 2, wherein the first gate electrode layer comprises a compensation gate electrode of a compensation thin-film transistor and a switching gate electrode of a switching thin-film transistor, and
the shielding conductive layer is arranged between the compensation gate electrode and the switching gate electrode.

5. The display apparatus of claim 1, further comprising a driving voltage line which extends in the second direction and arranged in a same layer as the data line, and the shielding conductive layer is arranged between the data line and the driving voltage line.

6. The display apparatus of claim 1, further comprising a compensation thin-film transistor connected to the first scanning line and comprising a compensation semiconductor layer and a compensation gate electrode, and
the other end of the node connection line is connected to the compensation semiconductor layer through a second node contact hole.

7. The display apparatus of claim 1, wherein a resistance value of the first scanning line is less than a resistance value of the driving gate electrode.

8. The display apparatus of claim 1, further comprising a storage capacitor comprising the driving gate electrode as a lower electrode and an upper electrode which overlaps the lower electrode and defines a storage opening having a closed shape, and
the first node contact hole is arranged in the storage opening.

9. The display apparatus of claim 8, wherein a size of the storage opening is greater than a size of the first node contact hole.

10. The display apparatus of claim 1, further comprising:
an emission control thin-film transistor arranged on the substrate and comprising an emission control semiconductor layer and an emission control gate electrode; and
an emission control line which delivers an emission control signal to the emission control gate electrode,
wherein the emission control gate electrode is provided as a portion of the emission control line.

11. The display apparatus of claim 1, further comprising:
a second scanning line apart from the first scanning line and extending in the first direction; and
a second gate electrode layer connected to the second scanning line through a fourth contact hole,
wherein the shielding conductive layer extends from the second gate electrode layer.

12. The display apparatus of claim 11, wherein the second gate electrode layer is a part of a first initialization gate electrode of a first initialization thin-film transistor.

13. The display apparatus of claim 12, wherein the first initialization gate electrode has a bent shape.

14. The display apparatus of claim 11, wherein the shielding conductive layer extends in the second direction.

15. A display apparatus comprising:
a substrate;
a driving thin-film transistor which is arranged on the substrate and comprises a driving gate electrode and a driving semiconductor layer arranged with a first gate insulating layer therebetween;
a shielding conductive layer arranged in a same layer as the driving gate electrode;
a second gate insulating layer and an interlayer insulating layer arranged on the shielding conductive layer;
a node connection line arranged on the interlayer insulating layer and connected to the driving gate electrode through a first node contact hole that penetrates the interlayer insulating layer and the second gate insulating layer;
a first scanning line arranged in a same layer as the node connection line and which extends in a first direction;
a via layer which covers the first scanning line and the node connection line; and a data line arranged on the via layer and which extends in a second direction that intersects with the first direction, wherein the shielding conductive layer extends in the second direction between the data line and the node connection line.

16. The display apparatus of claim 15, further comprising a first gate electrode layer connected to the first scanning line through a third contact hole, and the shielding conductive layer extends from the first gate electrode layer.

17. The display apparatus of claim 15, further comprising a second scanning line extending in the first direction; and a second gate electrode layer connected to the second scanning line through a fourth contact hole, and wherein the shielding conductive layer extends from the second gate electrode layer.

18. The display apparatus of claim 15, wherein the driving semiconductor layer is bent.

19. The display apparatus of claim 15, further comprising a driving voltage line which extends in the second direction and arranged in a same layer as the data line, and the node connection line overlaps the driving voltage line.

20. The display apparatus of claim 15, wherein the shielding conductive layer receives a scanning signal.

* * * * *